United States Patent [19]

Sadamori

[11] Patent Number: 4,822,757
[45] Date of Patent: Apr. 18, 1989

[54] SEMICONDUCTOR DEVICE AND METHOD OF MANUFACTURING THE SAME

[75] Inventor: Masaaki Sadamori, Fukuoka, Japan

[73] Assignee: Mitsubishi Denki Kabushiki Kaisha, Tokyo, Japan

[21] Appl. No.: 118,890

[22] Filed: Nov. 10, 1987

[51] Int. Cl.$^4$ .................. H01L 29/00; H01L 21/02; H01L 21/04; H01L 21/00

[52] U.S. Cl. ........................ 437/249; 437/6; 437/225; 148/DIG. 145; 51/325; 83/875; 408/204

[58] Field of Search .................. 51/325; 83/875; 408/204, 144, 145, 199, 203.5, 223, 227; 437/6, 249, 225; 148/DIG. 145, DIG. 168; 407/53, 54

[56] References Cited

FOREIGN PATENT DOCUMENTS 0014960 5/1970 Japan ................................ 437/249
60-157257 8/1985 Japan .
2100508 12/1982 United Kingdom ................ 437/249

OTHER PUBLICATIONS

The Electric Society Tokyo Branch General Meeting Monographies, The Sectional Committee [I], "Power Thyristor and the Problems in the Application Thereof" pp. 478–484, Ozu, Haruki, Kamei et al., published by the Electric Society in Tokyo, Dec. 1969.

IEEE Transactions on Electron Devices vol. ED-20, No. 6, Jun. 1973, "Depletion Layer Characteristics at the Surface of Beveled High-Voltage P-N Junctions", M. Bakowski and K. Ingemar Lundström.

Primary Examiner—Brian E. Hearn
Assistant Examiner—Byron Everhart
Attorney, Agent, or Firm—Oblon, Fisher, Spivak, McClelland & Maier

[57] ABSTRACT

The present invention relates to a semiconductor device which exposes a P-N junction portion in mesa groove to attain high reverse voltage blocking ability and a method of manufacturing the same. The mesa groove is provided in the form of a ring, and a section thereof is finished in positive bevel configuration being increased in width from a major surface toward an inner portion. Thus, a surface electric field of the mesa groove is weakened to attain high reverse voltage blocking ability, while the mesa groove of positive beveled structure can be accurately formed by employing a drill provided with a cutting edge having a mesa type sectional configuration.

4 Claims, 6 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and more particularly, it relates to a semiconductor device which obtains high reverse voltage blocking ability by exposing P-N junction portions in mesa grooves and a method of manufacturing the same. Description of the Prior Art FIG. 5 is a sectional view showing element structure of a conventional mesa thyristor which is described in "Introduction to Electronics 3, Magic Switch Thyristor" by Isao Shibazaki, issued on Dec. 14, 1985 from Seibundo Shinkosha, pp. 34–35. As shown in FIG. 5, a semiconductor wafer 1 is provided with a $P_E^+$-type impurity region 4, an $N_B^-$-type impurity region 5, a $P_B^+$-type impurity region 6 and an $N_E^{++}$-type impurity region 7 by well-known impurity diffusion means. Signs "+" and "−" show high and low absolute values of impurity concentration respectively, and sign "++" shows extremely high impurity concentration. The semiconductor wafer 1 is further provided on both major surfaces with mesa grooves 2, which are formed by a chemical etching process. The mesa grooves 2 tend to be V-shaped or U-shaped in section in case of a generally employed semiconductor wafer having crystal orientation of <1.1.1>. Passivation films 3 of passivation material such as silicon rubber, lead or glass are provided on the inner surfaces of the mesa grooves 2, in order to prevent deterioration of the mesa groove surfaces.

Description is now made on operation referring to reverse voltage blocking ability of a thyristor element. FIG. 6 is a sectional view showing an essential part of a chip separated from the semiconductor wafer 1 after formation of the mesa grooves 2. When switches S1 and S2 are turned on and off respectively in FIG. 6, a $P_E^+$-type region 4 and an $N_B^-$-type region 5 are forwardly biassed while the $N_B^-$-type region 5 and a $P_B^+$-type region 6 are reversely biassed. The $P_B^+$-type region 6 and an $N_E^{++}$-type region 7 are forwardly biassed. As is well known in the art, a depletion layer 8 is generated in the boundary between the $N_B^-$-type region 5 and the $P_B^+$-type region 6, to hold applied voltage. In a similar manner, when the switches S1 and S2 are turned off and on respectively, a depletion layer 9 is generated in the boundary between the $N_B^-$-type region 5 and the $P_E^+$-type region 4, to prevent voltage in an AC circuit. Although the $P_B^+$-type region 6 and the $N_E^{++}$-type region 7 are reversely biassed to be generated a depletion layer in the boundary between the same, such a depletion layer is merely slightly generated since the said regions are of high impurity concentration, and hence no current preventing ability is provided.

FIG. 7 is a graph showing relation between bevel angle and surface electric field. When voltage of 2000 V is reversely applied to a diode having an $N^-$-type region of impurity concentration ND of $5 \times 10^{13}$ atoms/cm$^3$ and a $P^+$-type region of a surface impurity concentration NS of $7 \times 10^{17}$ atoms/cm$^3$, the surface electric field is lowered in the so-called positive beveled structure in which the sectional area is reduced from a region of high impurity concentration toward a region of low impurity concentration, and hence influence by surface breakdown is small in an element of high reverse voltage blocking ability. However, the surface electric field is increased to easily cause surface breakdown in the so-called negative beveled structure in which the sectional area is increased from a region of high impurity concentration toward a region of low impurity concentration. Such surface breakdown easily takes place as the applied voltage is increased, to cause inconvenience in an element of high reverse voltage blocking ability. The bevel angle must be extremely increased in case of employing the negative beveled structure, whereas the effective chip area is decreased by such increase in bevel angle.

FIG. 8 shows relation between positive beveled structure and negative beveled structure. Referring to FIG. 8, a solid line 11 indicates the negative beveled structure and a dotted line 12 indicates the positive beveled structure. An inclination angle $\Gamma_a$ corresponds to the negative beveled structure 11 and an inclination angle $\theta_b$ corresponds to the positive beveled structure 12 respectively.

The mesa grooves 2 are preferably of the positive beveled structure in order to prevent increase in surface electric field, as hereinabove described.

In the conventional semiconductor device, however, the mesa grooves 2 tend to be of the negative beveled structure since the same are formed by chemical etching. In general, equipotential surfaces 10 of the depletion layers 8 and 9 are bent in groove surface regions perpendicularly to the groove surfaces for obtaining charge balance. Therefore, if the mesa grooves 2 are finished in negative beveled structure, the width of the depletion layer is larger in the inner portion than at the groove surface portion when voltage is applied, leading to increase in surface electric field. Although the semiconductor device having such mesa grooves of the negative beveled structure is simple in manufacturing process since the same is formed by chemical etching, the same cannot be applied to an element of high reverse voltage blocking ability applied voltage of 2000 V or more, for example. Further, when deep mesa grooves are obtained by etching, the depth of mesa grooves is so varied. When the depth of mesa grooves is shallow, prescribed reverse voltage blocking ability cannot be attained by increase in negative bevel angle. When the depth of mesa grooves is deep, the thickness of the semiconductor wafer at mesa groove portion is reduced to easily break the semiconductor wafer.

SUMMARY OF THE INVENTION

The present invention is directed to a semiconductor device having high reverse voltage blocking ability and a method of manufacturing the same.

A semiconductor device according to the present invention comprises a first conductivity type inner region of low impurity concentration, a second conductivity type outer region of high impurity concentration provided in the exterior of the inner region and a mesa groove of a ring-shaped configuration shaven from the outer region to said inner region to expose a junction between the outer region and the inner region and finished in mesa type sectional configurations being increased in width from the outer region surface toward the inner region.

A method of manufacturing a semiconductor device according to the present invention comprises a step of preparing a drill having a cutting edge provided along a circumferential direction about the center of curvature of a rotation axis within a surface perpendicular to the rotation axis, which cutting edge is finished in a mesa type configuration whose width is decreased from a head portion toward a bottom portion, a step of forming a semiconductor wafer having first conductivity type inner region of low impurity concentration and second conductivity type outer region of high impurity concentration provided in the exterior of the inner region, a step of rotatingly pressing the drill against the surface of the semiconductor wafer and relatively moving the same perpendicularly to a junction between the outer region and the inner region thereby to form a ring-shaped vertical groove exposing the junction, and a step of rotatingly relatively moving the drill parallelly to the junction thereby to finish the ring-shaped vertical groove in mesa type sectional configuration of positive beveled structure.

Accordingly, an object of the present invention is to provide a semiconductor device having a semiconductor wafer provided with a mesa groove of positive beveled structure to attain high reverse voltage blocking ability and a method of manufacturing the same.

Another object of the present invention is to provide a semiconductor device which can stabilize the yield by uniformalizing depth of a mesa groove and a method of manufacturing the same.

According to the present invention, the mesa groove is finished in sectional configuration of positive beveled structure, whereby the width of a depletion layer generated in the junction between the inner region and the outer region in voltage application is larger at the groove surface portion than in the inner portion, to implement high reverse voltage blocking ability. Further, such mesa groove is formed in the semiconductor wafer by employing a drill having a cutting edge of a mesa type sectional configuration whose width is decreased from a head portion toward a bottom portion, whereby a mesa groove of correct positive beveled structure can be implemented to restrict variation in mesa groove depth.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
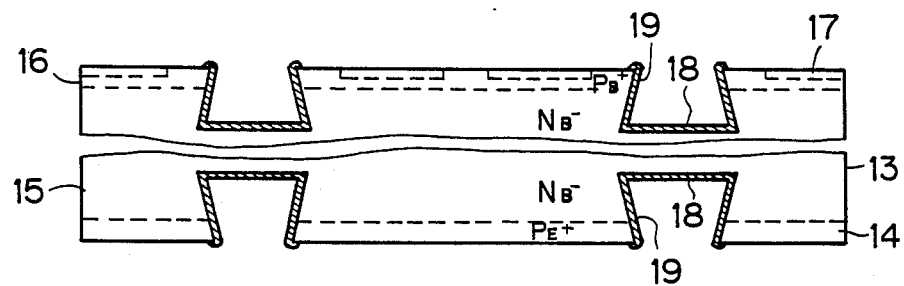
FIG. 1 is a sectional view showing element structure of a mesa thyristor according to an embodiment of the present invention.

FIG. 1 is a sectional view showing element structure of a mesa thyristor according to an embodiment of the present invention. As shown in FIG. 1, a semiconductor wafer 13 is provided with an $P_E{}^+$-type impurity region 14, an $N_B{}^-$-type impurity region 15, a $P_B{}^+$-type impurity region 16 and an $N_E{}^{++}$-type impurity region 17 by well-known impurity diffusion means. The $P_E{}^+$-type region 14 and the $P_B{}^+$-type region 16 serving as external regions are higher in impurity concentration than the $N_B{}^-$-type region 15 serving as an internal region respectively.

A ring-shaped mesa groove 18 is formed on one major surface of the semiconductor wafer 13 so that the junction between the $P_B{}^+$-type region 16 and the $N_B{}^-$-type region 15 is exposed. This mesa groove 18 is finished in a mesa type sectional configuration to be increased in width as the same is deepened from the surface of the $P_B{}^+$-type region 16 towarde the interior. Similarly, the semiconductor wafer 13 is also provided in its other major surface with another ring-shaped mesa groove 18 having a mesa type sectional configuration whose width is increased as the same is deepened from the surface of the $P_E{}^+$-type region 14 toward the interior. Passivation films 19 of passivation material such as silicon rubber, lead or glass are provided on the inner surfaces of the mesa grooves 18, in order to prevent deterioration of the mesa groove surfaces.

Description is now made on a method of manufacturing the aforementioned semiconductor device.

Figure 2:
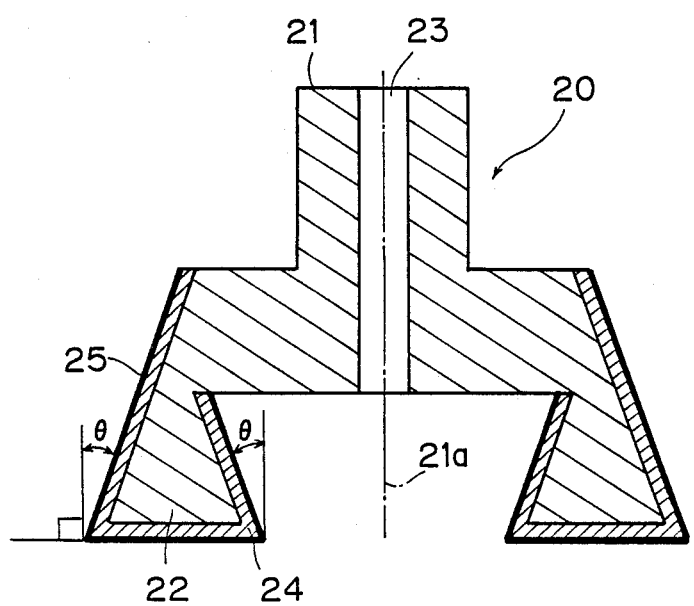
FIG. 2 is a sectional view of a drill employed in the process of manufacturing the element as shown in FIG. 1.

First, a drill 20 as shown in FIG. 2 is prepared. This drill 20 is provided with a cutting edge 22 along a circumferential direction about the center of curvature of an axis 21a of a rotating shaft 21 within a surface perpendicular to the axis 21a. The cutting edge 22 is finished in a mesa type sectional configuration such that the same is reduced in width from a head portion toward a bottom portion. The rotating shaft 21, being finished in a cylindrical configuration, is provided in its center with a grinding solution introducing path 23 along the axis 21a. The rotating shaft 21 and a cutting body of the drill 20 are formed by aluminum. A nickel plate 24 is adhered to the cutting body. Diamond fine particles 25 are coated on the surface of the nickel plate 24 by firing. Although an inclination angle of the inner and outer peripheral surfaces of the cutting edge 24 with respect to the axis 21a of the rotating shaft 21, i.e., an angle $\theta$ for implementing positive beveled structure must be calculated in design of the element, such an angle may be empirically at 40° or more in practice. Further, a grinding solution to be introduced into the grinding solution introducing path 23 may be prepared by water. The water introduced under pressure into the grinding solution introducing path 23 exudes from grain boundaries of the diamond fine particles 25 to cool the grinding surface while washing out scraps.

Figure 3A:
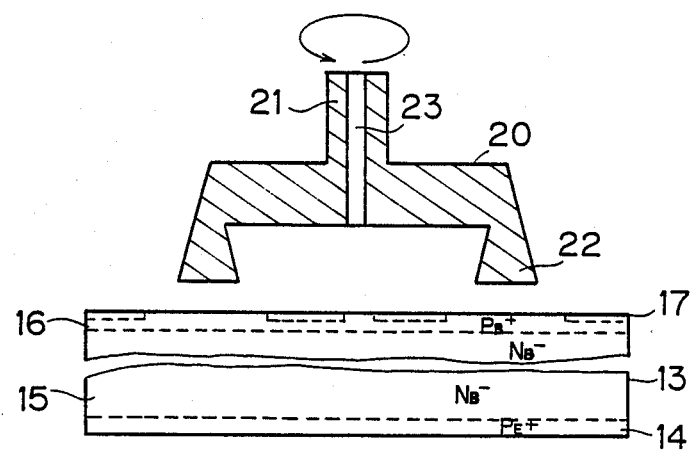
FIGS. 3A to 3E are sectional views showing steps of manufacturing the element as shown in FIG. 1.

While the aforementioned drill 20 is prepared, a semiconductor wafer 13 having a $P_E{}^+$-type region 14, an $N_B{}^-$-type region 15, $P_B{}^+$-type region 16 and an $N_E{}^{++}$-type region 17 as shown in FIG. 3A is formed and set in a prescribed position as shown in FIG. 3A.

Figure 3B:
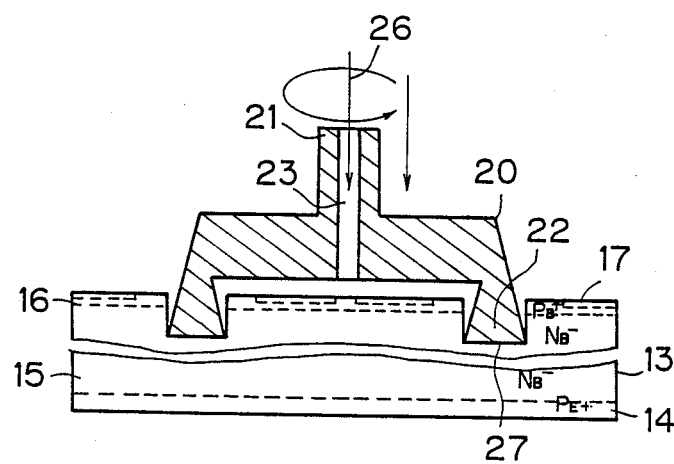

Then, as shown in FIG. 3B, the drill 20 is rotated about the rotating shaft 21 at a high speed of, e.g., 3000 to 8000 r.p.m. while introducing a grinding solution 26 from the grinding solution introducing path 23, and the cutting edge 22 is pressed against the surface of the semiconductor wafer 13 to be relatively moved perpendicularly to the junction between the $P_B{}^+$-type region 16 and the $N_B{}^-$-type region 15, thereby to form a ring-shaped vertical groove 27 exposing the said junction. The depth of the vertical groove 27 is empirically decided, basically in the same depth as that in the conventional etching process. When the $P_E{}^+$-type region 14 and the $P_B{}^+$-type region 16 are 50 to 60 μm in thickness, for example, appropriate groove depth is about 60 to 70 μm.

Figure 3C:
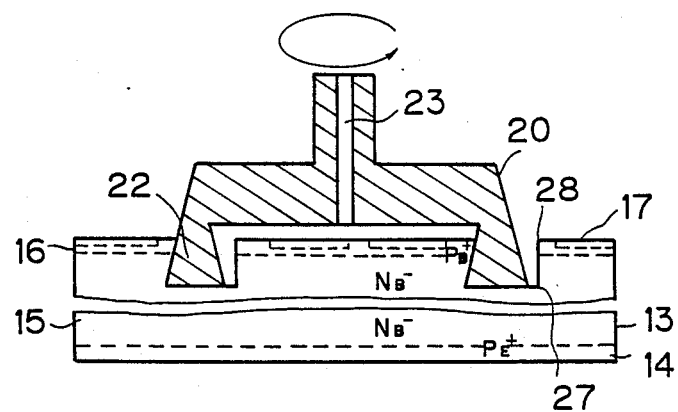
Figure 3D:
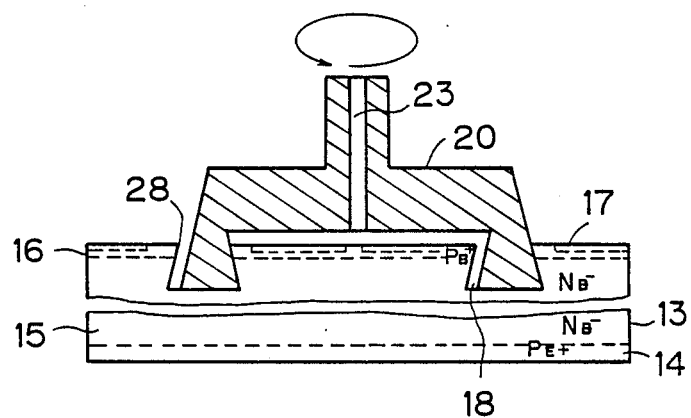

Then, as shown in FIG. 3C, grinding by the drill 20 is continued while moving the semiconductor wafer 13 little by little in the transverse direction, i.e., in a direction parallel to the P-N junction plane. In this case, the semiconductor wafer 13 is circularly moved so that the entire circumference is ground as shown in FIG. 3D. While the amount of transverse movement is decided in design of the element, the drill 20 may be moved to a corner 28 of the vertical groove 27 in comparison with the prior art example.

Figure 3E:
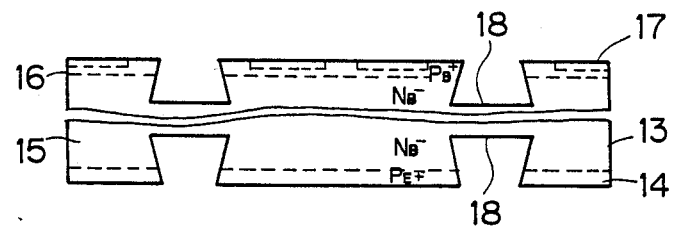

Thus, the mesa groove 18 of the positive beveled structure is formed in one major surface of the semiconductor wafer 13. Similarly, another mesa groove 18 of the positive beveled structure is formed in the other major surface of the semiconductor wafer 13, to finally obtain the semiconductor wafer 13 having the ring-shaped mesa grooves 18 as shown in FIG. 3E. The mesa grooves 18 may be formed at once in both surfaces of the semiconductor wafer 13.

After the mesa grooves 18 are formed, chemical etching is slightly performed for washing the mesa groove surfaces, thereby to remove surface worked layers caused by working processing by the drill 20. Thereafter passivation material such as silicon rubber, lead or glass is coated on the inner surfaces of the mesa grooves 18, thereby to form passivation films 19 as shown in FIG. 1.

Figure 4:
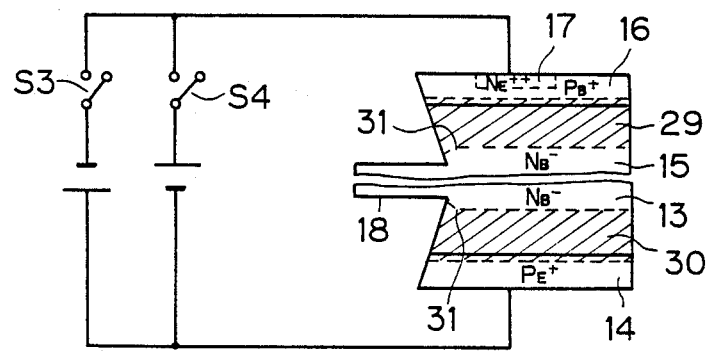
FIG. 4 is a partial sectional view showing a state of generating a depletion layers in case of applying voltage to mesa grooves of positive beveled structure in a semiconductor device according to the present invention.
Figure 5:
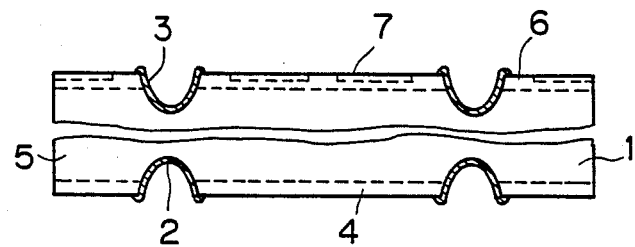
FIG. 5 is a sectional view showing element structure of a conventioned mesa thyristor.
Figure 6:
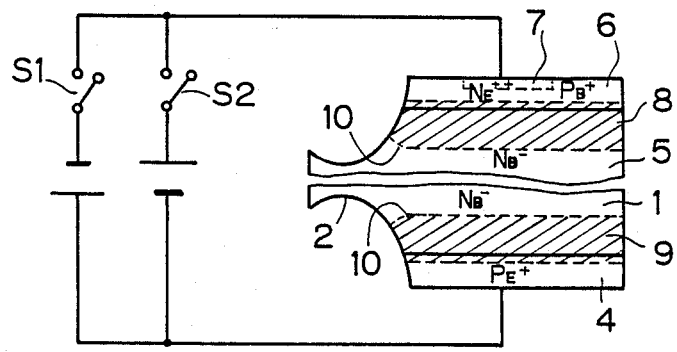
FIG. 6 is a partial sectional view showing a state of generating of depletion layers in case of applying voltage to conventional mesa grooves of negative beveled structure.
Figure 7:
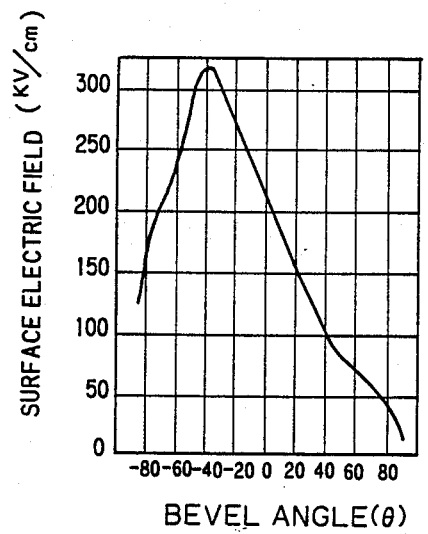
FIG. 7 is a graph showing relation between bevel angle and surface electric field.
Figure 8:
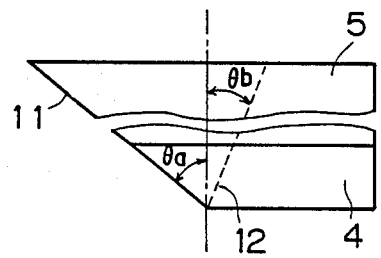
FIG. 8 is a partial sectional view showing inclination angles of positive beveled structure and negative beveled structure.

FIG. 4 is a partial sectional view showing a state of generating of depletion layers in case of applying voltage to a thyristor element having mesa grooves 18 of positive beveled structure. When switches S3 and S4 are turned on and off respectively, a depletion layer 29 is generated in the junction between an $N_B{}^-$-type region 15 and a $P_B{}^+$-type region 16. When switches S3 and S4 are turned off and on respectively, a depletion layer 30 is generated in the junction between a $P_E{}^+$-type region 14 and the $N_B{}^-$-type region 15. Since the inner surfaces of the mesa grooves 18 are in the positive beveled structure, equipotential surfaces 31 of the depletion layers 29 and 30 are bent perpendicularly to the groove surfaces, whereby the width of the depletion layers 29 and 30 is larger at the groove surface portions than in the inner portions. Consequently, the electric fields on the groove surfaces are weakened so that substantially no breakdown takes place on the groove surfaces even if high voltage is applied to the semiconductor wafer 13.

Since expansion of the width of depletion layers 29 and 30 is large in relatively low impurity concentration sides and small in relatively high concentration sides in inverse proportion to the amount of majority carriers, substantially no influence is exerted in actual increase of the surface electric fields even if the equipotential surfaces are bent in the high impurity concentration regions 14 and 16.

Further, the depth of the mesa grooves 18 is controlled by feeding the drill 20 by a precise motor or by precisely moving the semiconductor wafer 13. Therefore, the mesa grooves 18 are formed correctly in depth comparing with the case of conventional chemical etching process, thereby to prevent breakage of the semiconductor wafer 13 caused by excessive deepening of the mesa grooves 18 and to cope with increase the diameter of the semiconductor wafer 13.

Although the above description has been made with reference to a thyristor element, the present invention is also applicable to other semiconductor device which can employ the mesa type surface structure such as a diode, TRIAC (triode AC switch), a GTO thyristor, a reverse conducting thyristor or a transistor, to attain an effect similar to the above. Further, the material for the drill 20 may be prepared by other ceramics or metal such as grindstone or alumina in addition to the aforementioned material, or diamond fine particles may be adhered to the surface of a cutting edge prepared by such material.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having high reverse voltage blocking ability, said method comprising:
    a step of preparing a drill having a cutting edge provided along a circumferential direction about the center of curvature of a rotation axis within a surface perpendicular to said rotation axis, said cutting edge being finished in a mesa type sectional configuration being decreased in width from a head portion toward a bottom portion;
    a step of forming a semiconductor wafer having a first conductivity type inner region of low impurity concentration and a second conductivity type outer region of high impurity concentration provided in an exterior of said inner region;
    a step of relatively moving said drill perpendicularly to a junction between said outer region and said inner region while rotatingly pressing said drill against a surface of said semiconductor wafer, thereby to form a ring-shaped vertical groove exposing said junction; and
    a step of rotatingly relatively moving said drill parallelly to said junction, thereby to finish said ring-shaped vertical groove in mesa type sectional configurations of positive beveled structure.

2. A method of manufacturing a semiconductor device in accordance with claim 1, wherein
    a positive bevel angle of said mesa groove is set to be larger than 40°.

3. A method of manufacturing a semiconductor device in accordance with claim 1, wherein
    said mesa grooves are simultaneously formed on both surfaces of said semiconductor wafer by employing a pair of said drills.

4. A method of manufacturing a semiconductor device in accordance with claim 1, wherein
    said drill is provided by adhering a nickel plate on a cutting body formed in a mesa type section by aluminum and firing diamond fine particles on a surface of said nickel plate.

* * * * *